(12) United States Patent
Ito (10) Patent No.: US 11,869,863 B2
(45) Date of Patent: Jan. 9, 2024

(54) SEMICONDUCTOR DEVICE

(71) Applicant: SHINKO ELECTRIC INDUSTRIES CO., LTD., Nagano (JP)

(72) Inventor: Takashi Ito, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 126 days.

(21) Appl. No.: 17/537,792

(22) Filed: Nov. 30, 2021

(65) Prior Publication Data

US 2022/0181287 A1 Jun. 9, 2022

(30) Foreign Application Priority Data

Dec. 3, 2020 (JP) .................................. 2020-201155

(51) Int. Cl.
*H01L 23/48* (2006.01)
*H01L 23/00* (2006.01)
*H01L 23/31* (2006.01)

(52) U.S. Cl.
CPC .......... *H01L 24/20* (2013.01); *H01L 23/3185* (2013.01); *H01L 24/19* (2013.01); *H01L 24/32* (2013.01); *H01L 24/33* (2013.01); *H01L 2224/19* (2013.01); *H01L 2224/214* (2013.01); *H01L 2224/32225* (2013.01); *H01L 2224/32245* (2013.01); *H01L 2224/33181* (2013.01); *H01L 2924/1815* (2013.01)

(58) Field of Classification Search
CPC . H01L 23/3185; H01L 23/28; H01L 23/5389; H01L 2225/1094

USPC ......................................... 257/706, 713, 787
See application file for complete search history.

(56) References Cited

U.S. PATENT DOCUMENTS

| | | | | |
|---|---|---|---|---|
| 5,497,033 A | * | 3/1996 | Fillion | H01L 24/82 257/E25.011 |
| 5,744,863 A | * | 4/1998 | Culnane | H01L 23/367 257/E23.087 |
| 6,271,469 B1 | * | 8/2001 | Ma | H01L 24/96 174/521 |
| 6,506,632 B1 | * | 1/2003 | Cheng | H01L 21/6835 438/126 |
| 6,590,291 B2 | * | 7/2003 | Akagawa | H01L 24/82 257/784 |
| 6,952,049 B1 | * | 10/2005 | Ogawa | H01L 23/642 257/700 |
| 8,049,338 B2 | | 11/2011 | Delgado | |

(Continued)

*Primary Examiner* — Nitin Parekh
(74) *Attorney, Agent, or Firm* — TAROLLI, SUNDHEIM, COVELL & TUMMINO L.L.P.

(57) ABSTRACT

A semiconductor device includes a substrate, an adhesive layer formed on a lower surface of the substrate, a semiconductor element adhered to a lower surface of the adhesive layer, a through hole extending through the substrate and the adhesive layer and exposing a first electrode arranged on an upper surface of the semiconductor element, a via wiring formed in the through hole, a wiring layer formed on an upper surface of the substrate and electrically connected to the first electrode through the via wiring, and a protective insulation layer formed on the lower surface of the adhesive layer. The protective insulation layer covers an entirety of all side surfaces of the semiconductor element and a peripheral part of a lower surface of the semiconductor element and exposes a central part of the lower surface of the semiconductor element.

13 Claims, 10 Drawing Sheets

(56) References Cited

U.S. PATENT DOCUMENTS

| | | | | |
|---|---|---|---|---|
| 8,980,691 B2* | 3/2015 | Lin | ........................ | H01L 25/50 |
| | | | | 438/666 |
| 2002/0180035 A1* | 12/2002 | Huang | .................. | H01L 21/561 |
| | | | | 257/796 |
| 2012/0161331 A1* | 6/2012 | Gonzalez | ................ | H01L 24/24 |
| | | | | 257/774 |
| 2014/0138855 A1* | 5/2014 | Van Gemert | ....... | H01L 23/3114 |
| | | | | 438/114 |

* cited by examiner

SEMICONDUCTOR DEVICE

CROSS-REFERENCE TO RELATED APPLICATIONS

This application is based upon and claims the benefit of priority from prior Japanese Patent Application No. 2020-201155, filed on Dec. 3, 2020, the entire contents of which are incorporated herein by reference.

FIELD

This disclosure relates to a semiconductor device and a method for manufacturing the semiconductor device.

BACKGROUND

U.S. Pat. No. 8,049,338 describes a known semiconductor device in which a semiconductor element is adhered to a resin film of polyimide or the like by an adhesive layer. Further, a wiring layer is formed on the resin film at the side opposite to the adhesive layer.

SUMMARY

In such a semiconductor device, foreign matter may be caught between the adhesive layer and the semiconductor element when adhering the semiconductor element to the adhesive layer. This may form gaps between the adhesive layer and the semiconductor element. A plating solution may bleed into such gaps when forming the wiring layer and adversely affect the quality of the product.

An embodiment of a semiconductor device includes a substrate, an adhesive layer formed on a lower surface of the substrate, and a semiconductor element adhered to a lower surface of the adhesive layer. The semiconductor device includes a through hole that extends through the substrate and the adhesive layer and exposes a first electrode arranged on an upper surface of the semiconductor element. The semiconductor device also includes a via wiring formed in the through hole and a wiring layer formed on an upper surface of the substrate and electrically connected to the first electrode through the via wiring. The semiconductor device further includes a protective insulation layer formed on the lower surface of the adhesive layer. The protective insulation layer covers an entirety of all side surfaces of the semiconductor element and a peripheral part of a lower surface of the semiconductor element and exposes a central part of the lower surface of the semiconductor element.

BRIEF DESCRIPTION OF THE DRAWINGS

The embodiment, together with objects and advantages thereof, may best be understood by reference to the following description of the presently preferred embodiment together with the accompanying drawings in which.

DESCRIPTION OF THE EMBODIMENT

An embodiment will now be described with reference to the drawings.

The drawings may not be to scale, and the relative size, proportions, and depiction of elements in the drawings may be exaggerated for clarity, illustration, and convenience. Moreover, to facilitate understanding, hatching lines may not be illustrated or be replaced by shadings in the cross-sectional drawings. In the present specification, "plan view" refers to a view of a subject taken in a perpendicular direction (for example, the vertical direction in FIG. 1). Further, "planar shape" refers to a shape of a subject viewed in the perpendicular direction. Furthermore, in the present specification, the frame of reference for the upward, downward, leftward, and rightward directions is the reference numbers indicated in the drawing.

The structure of a semiconductor device 10 will now be described with reference to FIG. 1.

The semiconductor device 10 includes a substrate 20, an adhesive layer 30, and one or more (one in example of FIG. 1) semiconductor elements 40. The adhesive layer 30 is formed on a lower surface of the substrate 20. The semiconductor element 40 is adhered to a lower surface of the adhesive layer 30. The semiconductor element 40 includes side surfaces and a lower surface. The lower surface of the semiconductor element 40 includes a peripheral part and a central part. Further, the semiconductor device 10 includes a wiring layer 50 and a protective insulation layer 60. The wiring layer 50 is arranged on an upper surface of the substrate 20 and is electrically connected to the semiconductor element 40. The protective insulation layer 60 is arranged on the lower surface of the adhesive layer 30 and covers an entirety of all side surfaces of the semiconductor element 40 and a portion of the lower surface of the semiconductor element 40.

Each semiconductor element 40 may be, for example, a device of silicon (Si) or silicon carbide (SiC). Further, each semiconductor element 40 may be, for example, a device of gallium nitride (GaN), gallium arsenide (GaAs), or the like. For example, the semiconductor element 40 may be a semiconductor element (e.g. silicon chip such as central processing unit (CPU)) that acts as an active element. Alternatively, the semiconductor element 40 may be an active element such as an insulated gate bipolar transistor (IGBT), a metal-oxide-semiconductor field-effect transistor (MOSFET), or a diode. In the example of FIG. 1, the semiconductor element 40 includes electrodes on a main surface (upper surface in FIG. 1) and a back surface (lower surface in FIG. 1). The semiconductor element 40 may have any planar shape and any size. The semiconductor element 40 has a planar shape that is, for example, rectangular. The semiconductor element 40 may have a thickness of, for example, approximately 50 μm to 500 μm.

The semiconductor element 40 includes, for example, an electrode 41, an electrode 42, and an electrode 43. The electrodes 41 and 42 are formed, for example, in the upper surface of the semiconductor element 40. The electrodes 41 and 42 are separated from each other on the upper surface of the semiconductor element 40. The electrode 43 is formed, for example, in the lower surface of the semiconductor element 40. Each of the electrodes 41 and 42 is an example of a first electrode, and the electrode 43 is an example of a second electrode.

The material of the electrodes 41, 42, and 43 may be, for example, a metal such as aluminum (Al) or copper (Cu) or an alloy that includes at least one selected from the metals such as aluminum or copper. A surface-processed layer may be formed on the surfaces of the electrodes 41, 42, and 43. Examples of the surface-processed layer include a gold (Au) layer, a nickel (Ni) layer/Au layer (metal layer in which Au layer is formed on Ni layer with Ni layer serving as bottom layer), a Ni layer/palladium (Pd) layer/Au layer (metal layer in which Ni layer, Pd layer, and Au layer are formed in order with Ni layer serving as bottom layer). The Au layer, Ni layer, Pd layer may each be, for example, an electroless plating metal layer formed in an electroless plating process. The Au layer is a metal layer of Au or an Au alloy. The Ni layer is a metal layer of Ni or a Ni alloy. The Pd layer is a metal layer of Pd or a Pd alloy.

The substrate 20 may be, for example, a tape-like substrate or a flexible substrate. For example, the substrate 20 may be a resin film. The material of the resin film may be an insulative resin such as a polyimide-based resin, a polyethylene-based resin, or an epoxy-based resin. For example, the substrate 20 has flexibility. Flexibility refers to a property allowing for bending and flexing. The substrate 20 may have any planar shape and any size. The substrate 20 has a planar shape that is, for example, rectangular. The substrate 20 may have a thickness of, for example, approximately 50 μm to 100 μm.

The adhesive layer 30 covers the lower surface of the substrate 20. The adhesive layer 30 covers, for example, the entire lower surface of the substrate 20. The adhesive layer 30 adheres the semiconductor element 40 to the substrate 20. In the example of FIG. 1, the adhesive layer 30 is adhered to the lower surface of the substrate 20 and the upper surface of the semiconductor element 40. Thus, the semiconductor element 40 is mounted on the lower surface of the substrate 20 by the adhesive layer 30. The semiconductor element 40 is adhered to the lower surface of the adhesive layer 30.

The material of the adhesive layer 30 may be, for example, an adhesive that is epoxy-based, polyimide-based, silicone-based, or the like. The adhesive layer 30 may have a thickness of, for example, approximately 20 μm to 40 μm.

Through holes 21 extend through the substrate 20 and the adhesive layer 30 in a thickness-wise direction of the substrate 20 and the adhesive layer 30. The through holes 21 expose parts of the upper surface of the electrodes 41 and 42. The through holes 21 are tapered so that the opening width (opening diameter) decreases from the upper side (upper surface of substrate 20) toward the lower side (lower surface of adhesive layer 30) as viewed in FIG. 1.

The wiring layer 50 is formed on the upper surface of the substrate 20. The wiring layer 50 is electrically connected to the electrode 41 or the electrode 42 through via wiring V1 formed in the through holes 21. The wiring layer 50 is, for example, formed integrally with the via wiring V1. For example, each through hole 21 is filled with the via wiring V1. The via wiring V1 extends through the substrate 20 and the adhesive layer 30 in the thickness-wise direction.

The wiring layer 50 and the via wiring V1 include a seed layer 51 that covers, for example, the upper surface of the substrate 20 and the wall surfaces of the through holes 21. In the example of FIG. 1, the seed layer 51 continuously covers the upper surface of the substrate 20, the wall surfaces of the through holes 21, and the upper surfaces of the electrodes 41 and 42, which are exposed at the bottom of the through holes 21. The seed layer 51 may be a metal film (sputtering film) formed through a sputtering process. When the seed layer 51 is formed through a sputtering process, the seed layer 51 may be, for example, a metal film having a double-layered structure in which a layer of titanium (Ti) and a layer of copper (Cu) are formed, in order, on the upper surface of the substrate 20 and the wall surfaces of the through holes 21. In this case, the thickness of the Ti layer may be, for example, approximately 10 nm to 300 nm, and the thickness of the Cu layer may be, for example, approximately 100 nm to 1000 nm. The Ti layer acts as an adhering layer that improves adhesion of the seed layer 51 to the substrate 20, the electrodes 41 and 42, and the like. Also, the Ti layer acts as a metal barrier layer that restricts diffusion of copper from the Cu layer and the like to the substrate 20 and the like. The material of such a metal film acting as an adhering layer and a metal barrier layer may be, in addition to Ti, titanium nitride (TiN), tantalum nitride (TaN), tantalum (Ta), chromium (Cr), or the like.

The via wiring V1 includes a metal layer 52 that is formed on the seed layer 51 and fills the through holes 21. The material of the metal layer 52 may be, for example, copper or a copper alloy. The metal layer 52 may be, for example, an electrolytic plating metal layer formed through an electrolytic plating process. In the example of FIG. 1, the via wiring V1 is formed by the seed layer 51 arranged in the through hole 21 and the metal layer 52.

The wiring layer 50 includes a metal layer 53. The metal layer 53 is formed on the via wiring V1 (metal layer 52) and the seed layer 51 located on the upper surface of the substrate 20. The metal layer 53 is, for example, formed integrally with the metal layer 52. The material of the metal layer 53 may be, for example, copper or a copper alloy. The metal layer 53 may be, for example, an electrolytic plating metal layer formed through an electrolytic plating process. In the example of FIG. 1, the wiring layer 50 includes the metal layer 53 and the seed layer 51, which is located on the upper surface of the substrate 20.

The protective insulation layer 60 covers the lower surface of the adhesive layer 30. The protective insulation layer 60 contacts the lower surface of the adhesive layer 30. The protective insulation layer 60 covers the entirety of all the side surfaces of the semiconductor element 40 in a state in which the protective insulation layer 60 is in contact with the entirety of all the side surfaces of the semiconductor element 40. The protective insulation layer 60 covers, for example, a portion of the lower surface of the semiconductor element 40. The protective insulation layer 60 contacts a portion of the lower surface of the semiconductor element 40. In the example of FIG. 1, the protective insulation layer 60 covers the peripheral part of the lower surface of the semiconductor element 40.

Figure 1:
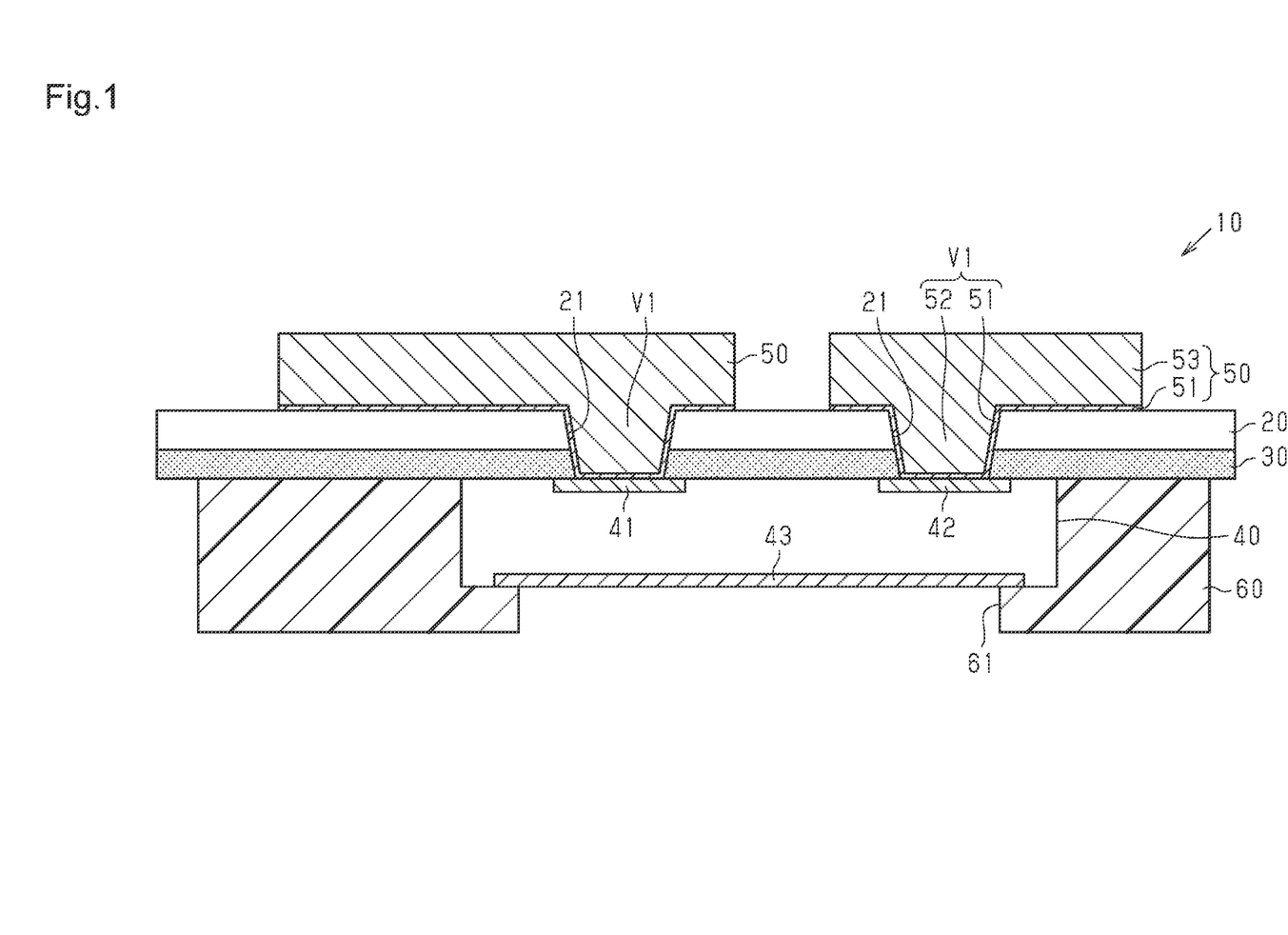
FIG. 1 is a schematic cross-sectional view (taken along line 1-1 illustrated in FIG. 2) of a semiconductor device in accordance with an embodiment.
Figure 2:
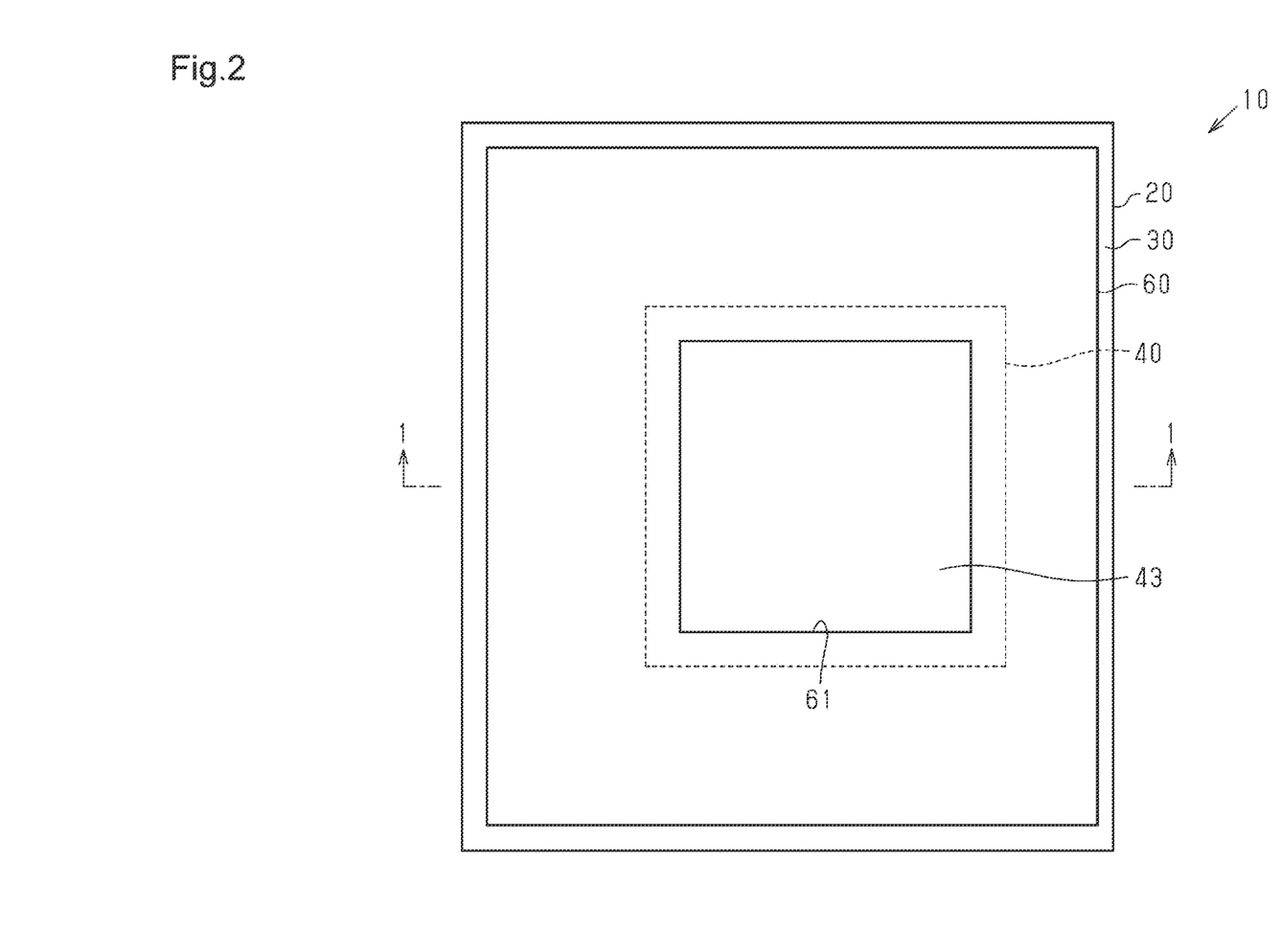
FIG. 2 is a schematic plan view of the semiconductor device illustrated in FIG. 1.

As illustrated in FIG. 2, the protective insulation layer 60 continuously and entirely covers the peripheral part of the lower surface of the semiconductor element 40. FIG. 2 is a plan view of the semiconductor device 10 illustrated in FIG. 1 taken from the lower side. The protective insulation layer 60 exposes the central part of the lower surface of the semiconductor element 40. That is, the protective insulation layer 60 includes an opening 61 that exposes part of the lower surface of the semiconductor element 40. The opening 61 exposes, for example, the lower surface of the electrode 43 arranged on the lower surface of the semiconductor element 40. The opening 61 may have any planar shape and any size. The opening 61 has a planar shape that is, for example, rectangular. In plan view, the opening 61 is smaller than the semiconductor element 40. In the example of FIG.

1, the opening 61 exposes a central part of the lower surface of the electrode 43 (as the central part of the lower surface of the semiconductor element 40). In this case, the protective insulation layer 60 covers a peripheral part of the lower surface of the electrode 43 and the peripheral part of the lower surface of the semiconductor element 40 and exposes the central part of the lower surface of the electrode 43 through the opening 61. The thickness of the protective insulation layer 60 from the lower surface of the semiconductor element 40 (lower surface of electrode 43) to the lower surface of the protective insulation layer 60 may be, for example, approximately 5 μm to 50 μm.

The protective insulation layer 60 is larger in plan view than the semiconductor element 40. Further, the protective insulation layer 60 is smaller in plan view than, for example, the adhesive layer 30. In the example of FIG. 1, the protective insulation layer 60 is slightly smaller in plan view than the adhesive layer 30. In this case, the protective insulation layer 60 may partially cover the lower surface of the adhesive layer 30 and continuously and entirely expose the peripheral part of the lower surface of the adhesive layer 30.

As illustrated in FIG. 1, the outer side surfaces of the protective insulation layer 60 are located inward from the outer side surfaces of the adhesive layer 30. In other words, the adhesive layer 30 extends outward beyond the outer side surfaces of the protective insulation layer 60. In this manner, the semiconductor device 10 includes a step that is formed by the outer side surfaces of the protective insulation layer 60, the lower surface of the adhesive layer 30 exposed from the protective insulation layer 60, and the outer side surfaces of the adhesive layer 30. Further, the substrate 20 extends outward beyond the outer side surfaces of the protective insulation layer 60. The outer side surfaces of the adhesive layer 30 are, for example, flush with the outer side surfaces of the substrate 20. For example, the outer side surfaces of the adhesive layer 30 and the outer side surfaces of the substrate 20 are cut surfaces.

The protective insulation layer 60 may be, for example, a solder resist layer. The material of the protective insulation layer 60 may be, for example, an insulative resin including the main component of a photosensitive resin such as phenol resin or epoxy resin. The protective insulation layer 60 may include, for example, a filler such as silica or alumina. For example, the material of the protective insulation layer 60 is not limited to an insulative resin including the main component of a photosensitive resin and may be, for example, an insulative resin including the main component of a non-photosensitive resin such as a thermosetting resin.

Method for Manufacturing Semiconductor Device 10

A method for manufacturing the semiconductor device 10 will now be described with reference to FIGS. 3A to 6B. Hereinafter, the method described below is a batch manufacturing process that fabricates a structural body including a batch of devices, each corresponding to the semiconductor device 10, and then fragmenting the structural body into a plurality of semiconductor devices 10. To facilitate understanding, each element of the semiconductor device 10 is described using the same reference characters throughout the different stages of manufacturing.

Figure 3A:
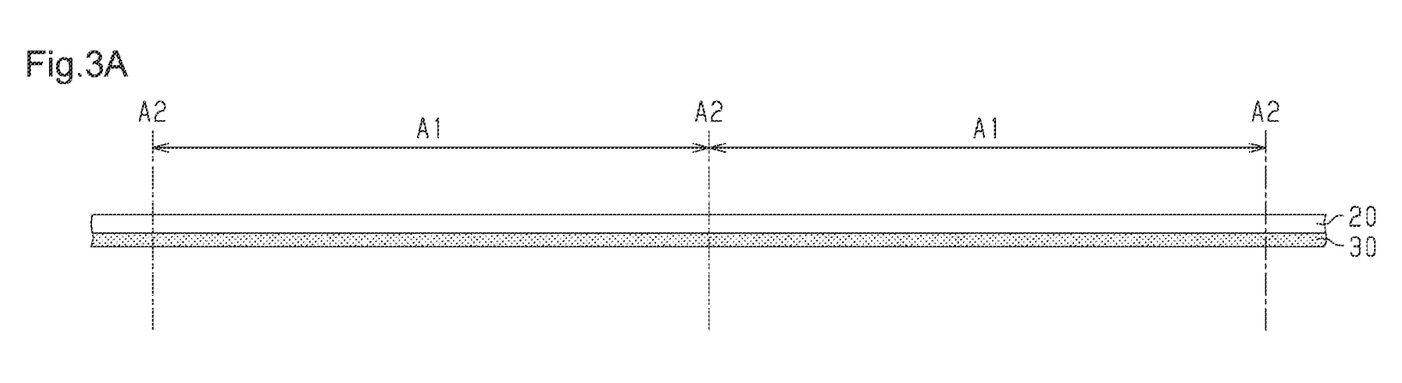
FIGS. 3A, 3B, 4A, 4B, 5A, 5B, 6A, 6B, and 7 are schematic cross-sectional views illustrating a method for manufacturing the semiconductor device illustrated in FIG. 1.

First, in the step illustrated in FIG. 3A, a large substrate 20 is prepared. The large substrate 20 includes, for example, individual regions A1. A semiconductor device 10 will be formed in each individual region A1. For example, the individual regions A1 are arranged in a matrix pattern. The substrate 20 is ultimately fragmented into semiconductor devices 10 by cutting out the individual regions A1 along cutting lines A2. There is no particular limitation to the number of the individual regions A1 formed in the substrate 20.

As illustrated in FIG. 3A, the adhesive layer 30 is formed on the lower surface of the substrate 20 to cover the entire lower surface of the substrate 20.

Figure 3B:
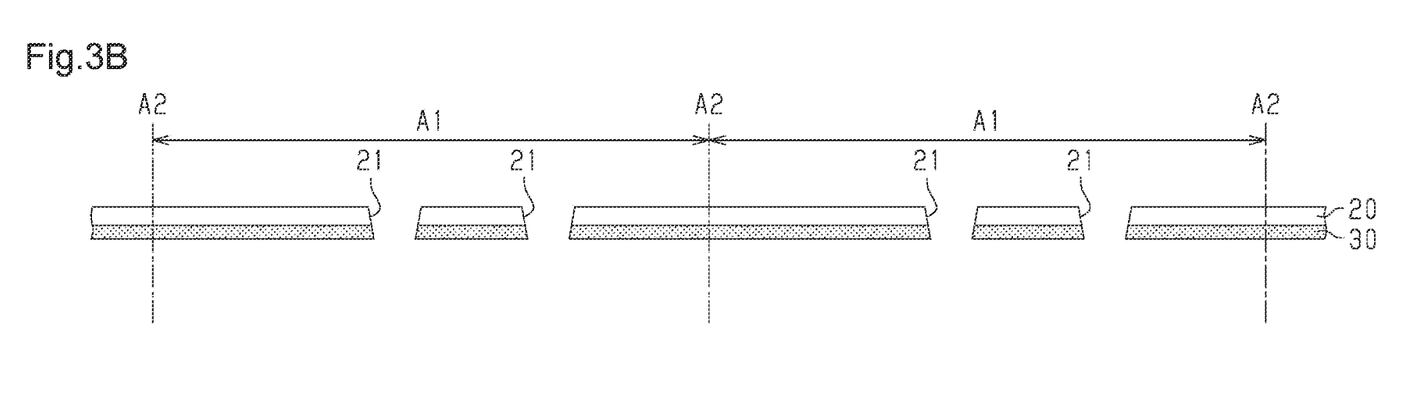

In the step illustrated in FIG. 3B, through holes 21 extending through the substrate 20 and the adhesive layer 30 in the thickness-wise direction are formed at specified locations. The through holes 21 may be formed through, for example, punching or laser processing using a $CO_2$ laser beam, UV-YAG laser beam, or the like.

Figure 4A:
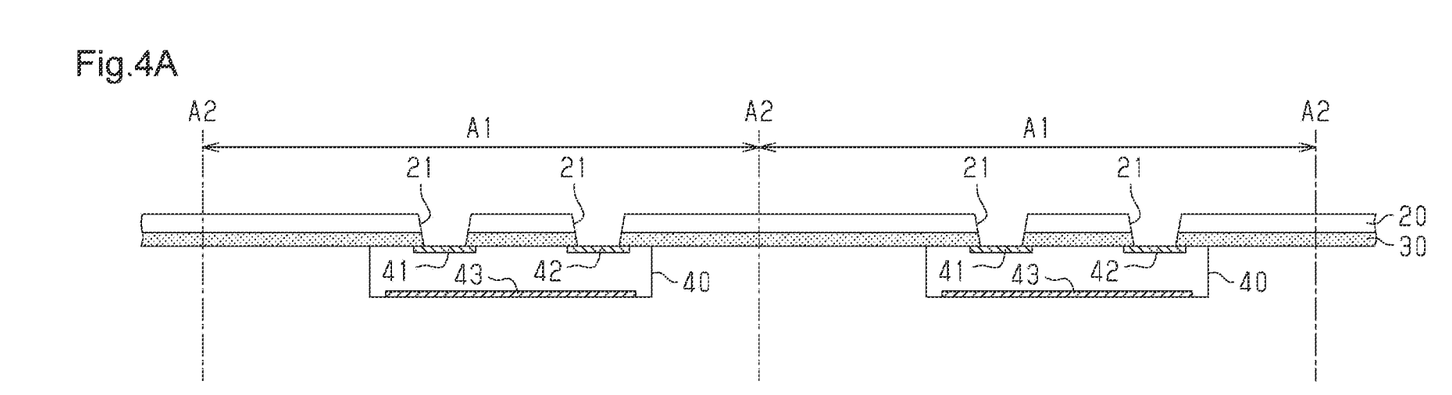

In the step illustrated in FIG. 4A, semiconductor elements 40 are mounted on the substrate 20. In the example of FIG. 4A, the electrodes 41 and 42 of each semiconductor element 40 are aligned with the corresponding through holes 21 in plan view, and the semiconductor element 40 is adhered to the lower surface of the adhesive layer 30.

Figure 4B:
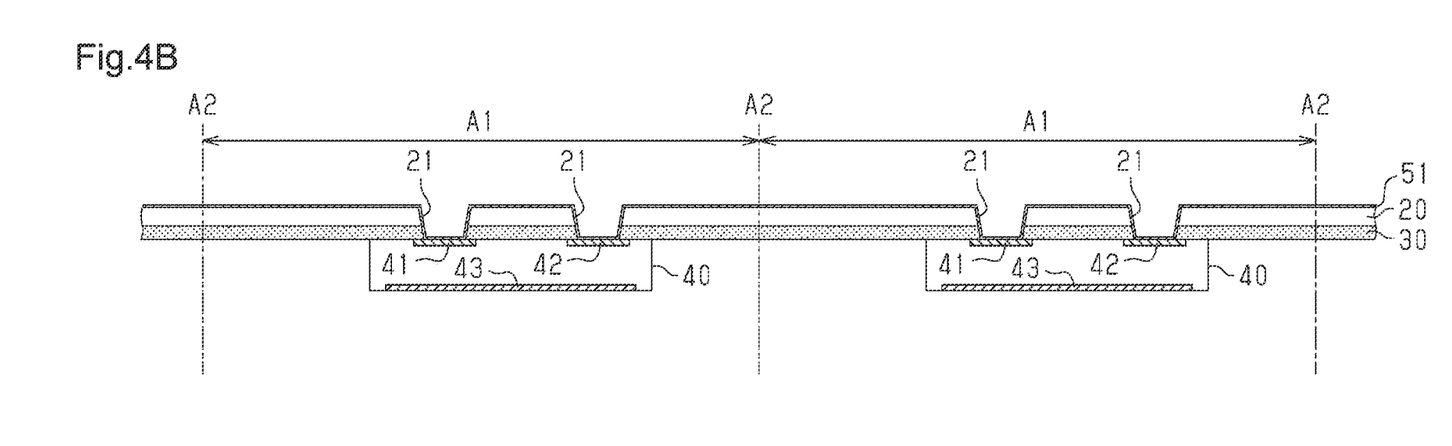

In the step illustrated in FIG. 4B, the seed layer 51 is formed to entirely cover the upper surface of the substrate 20 and the wall surfaces of the through holes 21. The seed layer 51 may be formed through, for example, sputtering or electroless plating. For example, when the seed layer 51 is formed through sputtering, titanium is first sputtered and deposited on the upper surface of the substrate 20 and the wall surface of the through hole 21 to form a Ti layer. Subsequently, copper is sputtered and deposited on the Ti layer to form a Cu layer. This forms the seed layer 51 with a double-layered structure (Ti layer/Cu layer). Alternatively, when the seed layer 51 is formed through electroless platin, for example, electroless copper plating may be performed to form the seed layer 51 with a single-layered structure (Cu layer).

Figure 5A:
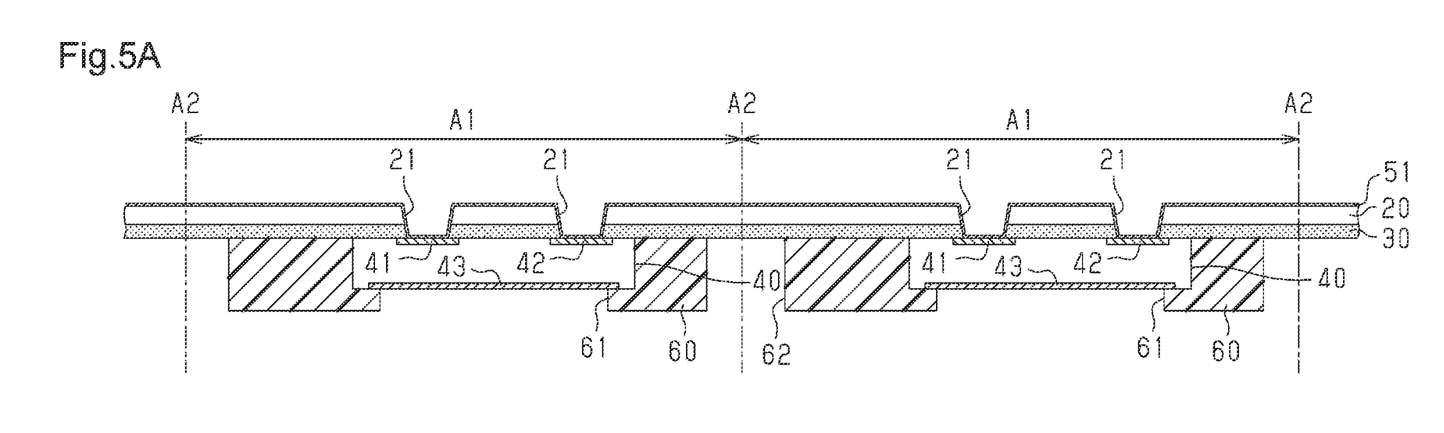

In the step illustrated in FIG. 5A, the protective insulation layer 60 is formed on the lower surface of the adhesive layer 30 to cover the entirety of all the side surfaces of each semiconductor element 40 and to cover a portion of the lower surface of each semiconductor element 40. The protective insulation layer 60 contacts and covers the entirety of all the side surfaces of the semiconductor element 40. The protective insulation layer 60 contacts and covers a portion of the semiconductor element 40. An opening 61 is formed in the protective insulation layer 60 to expose the central part of the lower surface of each semiconductor element 40. For example, the protective insulation layer 60 is formed in correspondence with each individual region A1. Thus, two protective insulation layers 60 arranged in two adjacent individual regions A1 are separated from each other. A through hole 62 formed between two adjacent protective insulation layers 60 exposes the lower surface of the adhesive layer 30. The through hole 62 includes the cutting lines A2 and the periphery of the cutting lines A2. In other words, the protective insulation layer 60 is not formed on the cutting lines A2 and the periphery of the cutting lines A2. The protective insulation layer 60 may be formed by, for example, applying a liquid or paste of resin onto the lower surface of the adhesive layer 30 with a dispenser or the like. Alternatively, the protective insulation layer 60 may be formed by, for example, laminating a photosensitive solder resist film or applying a liquid solder resist and then performing photolithography to pattern the resist into a specified shape.

Figure 5B:
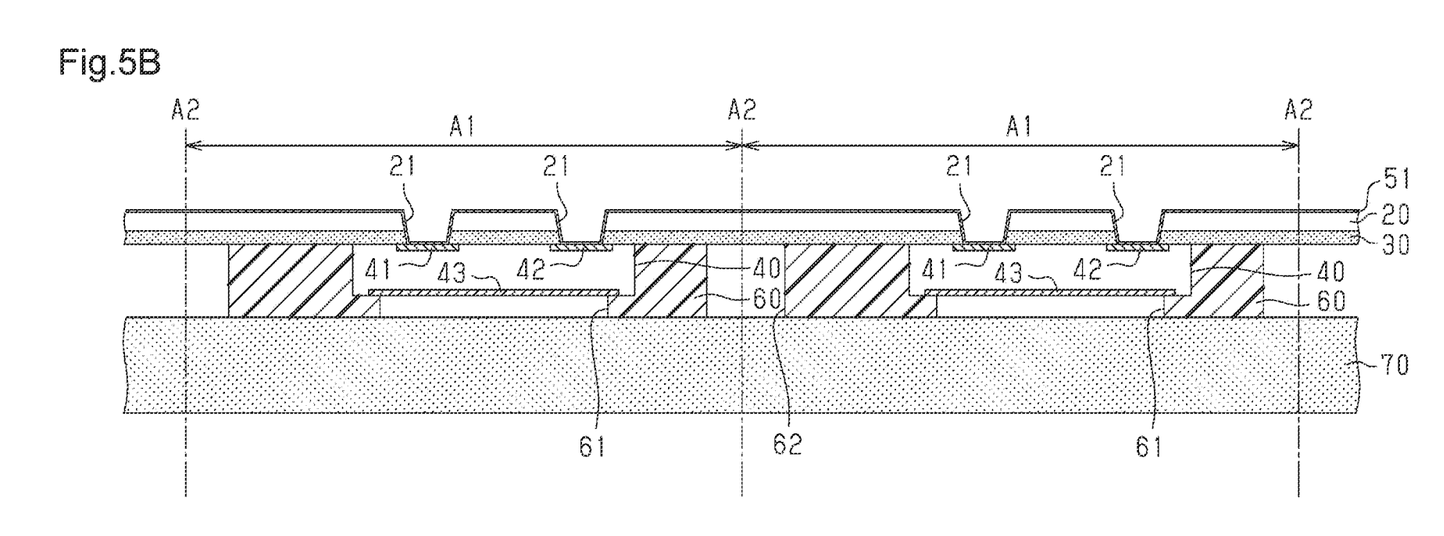

In the step illustrated in FIG. 5B, a protection film 70 is formed on the lower surface of the protective insulation layer 60. For example, the protection film 70 is adhered to the lower surface of the protective insulation layer 60 to cover the entire lower surface of the protective insulation layer 60. The protection film 70 closes the openings 61 of the protective insulation layer 60. The protection film 70 avoids, for example, a plating solution from contacting the surface of each semiconductor element 40 in a subsequent electrolytic plating step. The protection film 70 is, for example, flat. For example, the same protection film 70 is arranged on the individual regions A1. The protection film 70 may be, for example, a film of polyimide, polycarbonate, polyester, polyethylene terephthalate (PET) or the like. A delamination agent or electrostatic coating is applied to the surface of the protection film 70. The delamination agent may be, for example, a silicone-based delamination agent or a fluorine-based delamination agent. The surface of the protection film 70 coated with a delamination agent is adhered to the lower surface of the protective insulation layer 60.

If the protective insulation layer 60 were not formed, for example, the upper surface of the protection film 70 would need to include recesses surrounding the semiconductor elements 40 to accommodate the semiconductor elements 40. In this case, the recesses formed in the individual region A1 will need to be formed in correspondence with the number and the layout of the semiconductor elements 40. This would increase the number of manufacturing steps and raise the manufacturing cost of the protection film 70. In this respect, the protective insulation layer 60 is formed in the step of FIG. 5A to cover the entirety of all the side surfaces of the semiconductor element 40 and to cover a portion of the lower surface of each semiconductor element 40. Accordingly, when the protection film 70 is formed to close each opening 61 of the protective insulation layer 60, the semiconductor element 40 is protected from the plating solution. This eliminates the need for recesses in the upper surface of the protection film 70 and facilitates formation of the protection film 70 thereby minimizing the manufacturing cost of the protection film 70.

Figure 6A:
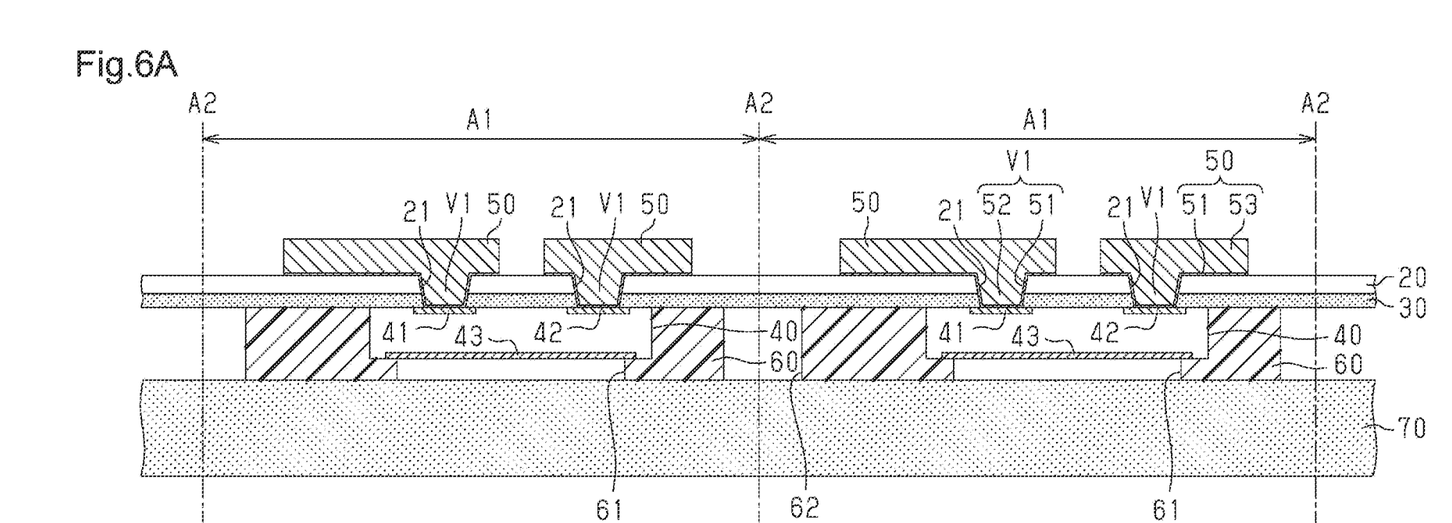

In the step illustrated in FIG. 6A, the via wiring V1 is formed in the through holes 21. Also, the wiring layer 50 is arranged on the upper surface of the substrate 20 and electrically connected to the electrode 41 or the electrode 42 through the via wiring V1. The via wiring V1 and the wiring layer 50 may be formed by, for example, various types of wiring formation process such as a subtractive process or a semi-additive process. The subtractive process will now be briefly described as one example of a process for forming the via wiring V1 and the wiring layer 50.

First, an electrolytic plating (e.g., electrolytic copper plating) is performed using the protection film 70 as a mask and using the seed layer 51 as a power supplying layer to form the metal layer 52 in the through holes 21 on the seed layer 51 so that the through holes 21 are filled with the metal layer 52. Further, the electrolytic plating is continuously performed to form the metal layer 53 covering the entire upper surface of the seed layer 51 on the substrate 20. The metal layer 53 is formed integrally with the metal layer 52. Subsequently, a resist layer (not illustrated) covering the metal layer 53 is formed on the upper surface of the metal layer 53 at positions corresponding to the wiring layer 50. The resist layer is used as a mask when performing etching to remove portions of the metal layer 53 and the seed layer 51 that are not covered by the resist layer. Then, the resist layer is removed. In this manner, the via wiring V1 is formed by the seed layer 51 and the metal layer 52, and the wiring layer 50 is formed by the seed layer 51 and the metal layer 53.

In the step illustrated in FIG. 4A, that is, the step of adhering the semiconductor element 40 to the lower surface of the adhesive layer 30, foreign matter may be caught between the adhesive layer 30 and the semiconductor element 40. When foreign matter is caught between the adhesive layer 30 and the semiconductor element 40, gaps will be formed between the adhesive layer 30 and the semiconductor element 40. If the structural body in such a state undergoes electrolytic plating (step of FIG. 5B), plating solution will enter the gaps between the adhesive layer 30 and the semiconductor element 40. In such a case, if the protective insulation layer 60 were not formed, the plating solution in the voids between the adhesive layer 30 and the semiconductor element 40 will move along the side surfaces of the semiconductor element 40 to the lower surface of the semiconductor element 40. Accordingly, the plating solution will contact the lower surface of the electrode 43 and adversely affect the quality of the semiconductor device 10. In this respect, in the step of FIG. 5A, the protective insulation layer 60 is formed to contact and cover the entirety of all the side surfaces of each semiconductor element 40 as well as to partially contact and cover the lower surface of the semiconductor element 40. That is, the protective insulation layer 60 is in contact with the side surfaces of the semiconductor element 40 without any gap between the protective insulation layer 60 and the side surfaces of the semiconductor element 40. Thus, even when gaps are formed between the semiconductor element 40 and the adhesive layer 30, plating solution will not bleed between the side surfaces of the semiconductor element 40 and the protective insulation layer 60. This avoids contact of the plating solution with the electrode 43 arranged on the lower surface of the semiconductor element 40.

Figure 6B:
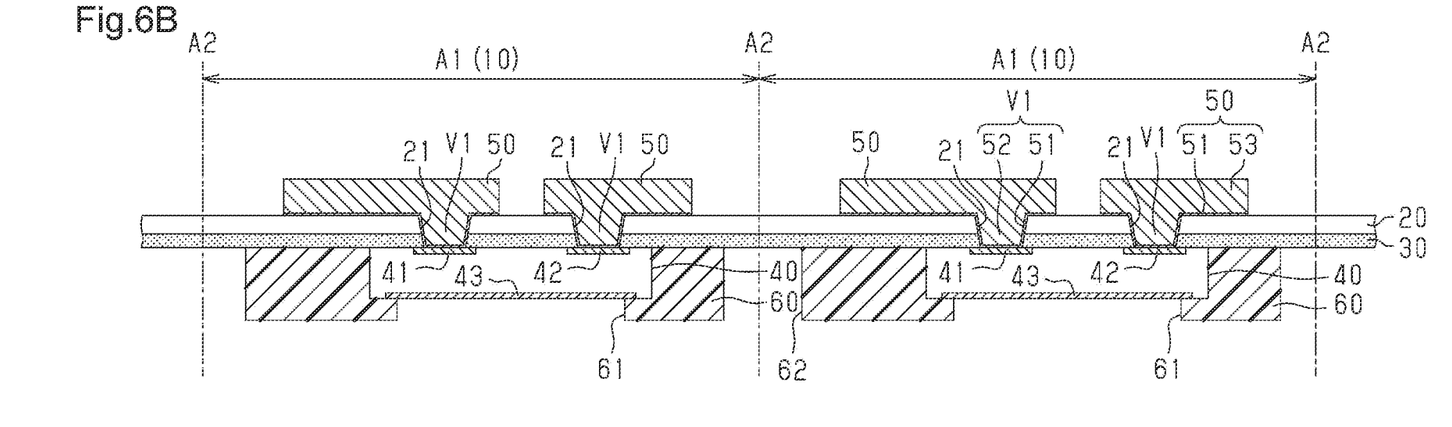

Subsequently, the protection film 70 illustrated in FIG. 6A is removed. For example, the protection film 70 is delaminated from the lower surface of the protective insulation layer 60. This exposes the lower surface of the protective insulation layer 60 to the outside as illustrated in FIG. 6B. This manufactures the structural body with the semiconductor devices 10 formed in the corresponding individual regions A1.

Figure 7:
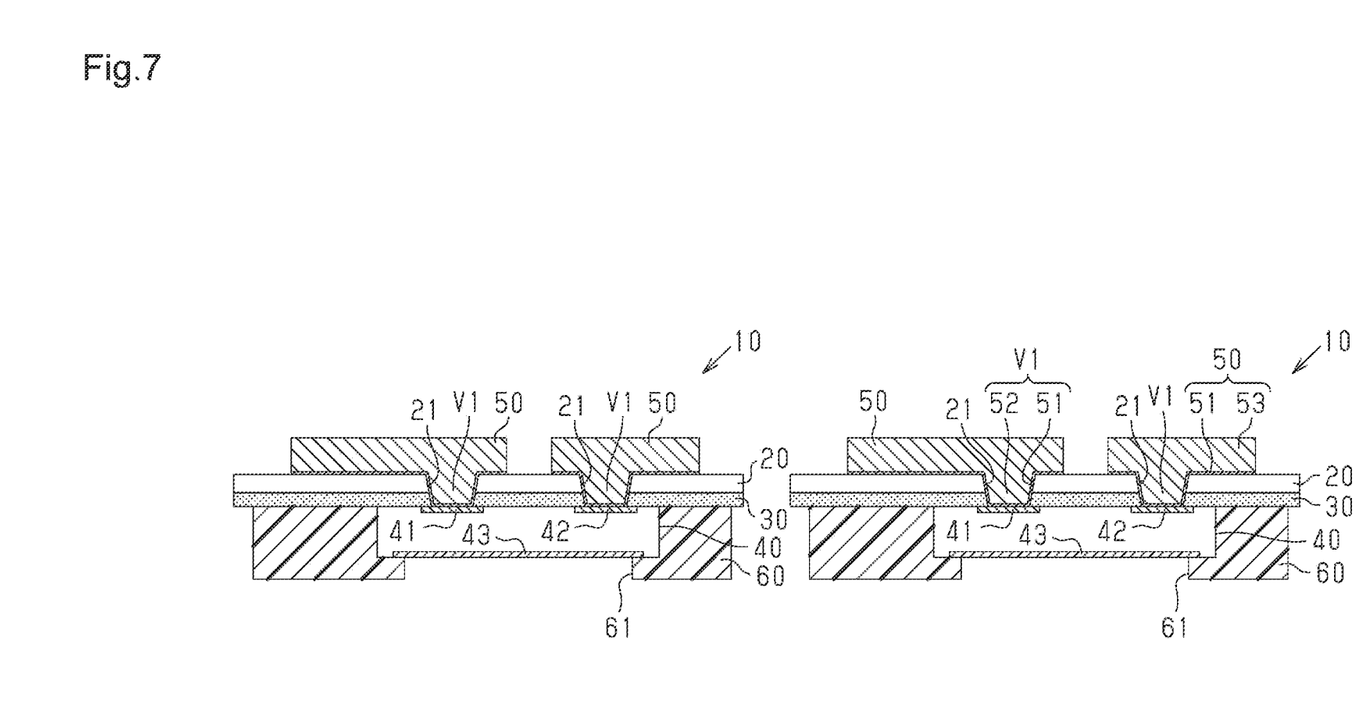

Then, the structural body illustrated in FIG. 6B is cut along the cutting lines A2 with a dicing blade or the like. In the example of FIG. 6B, the substrate 20 and the adhesive layer 30 are cut along the cutting lines A2. Accordingly, the structural body is fragmented into the semiconductor devices 10 as illustrated in FIG. 7. In the structural body illustrated in FIG. 6B, only the substrate 20 and the adhesive layer 30 are cut along the cutting lines A2 with a dicing blade or the like. Thus, the cut surfaces of each semiconductor device 10 subsequent to the fragmentation only expose the outer side surfaces of the substrate 20 and the adhesive layer 30. That is, the outer side surfaces of the substrate 20 are flush with the outer side surfaces of the adhesive layer 30 on the cut surfaces. In other words, the protective insulation layer 60 is not cut since the protective insulation layer 60 is not arranged on the cutting lines A2. This prevents delamination between the adhesive layer 30 and the protective insulation layer 60.

The semiconductor device 10 subsequent to fragmentation may be used in a flipped state or arranged at any angle.

The present embodiment has the following advantages.

(1) The protective insulation layer 60 formed on the lower surface of the adhesive layer 30 covers the entirety of all the side surfaces of the semiconductor element 40 and partially covers the lower surface of the semiconductor element 40. There are no gaps between the side surfaces of the semiconductor element 40 and the protective insulation layer 60. Thus, even when, for example, foreign matter caught between the semiconductor element 40 and the adhesive layer 30 form gaps, plating solution will not bleed between the side surfaces of the semiconductor element 40 and the protective insulation layer 60. This avoids contact of the plating solution with the electrode 43 arranged on the lower surface of the semiconductor element 40. Consequently, the quality of the semiconductor device 10 is maintained in a preferred manner.

(2) The arrangement of the protective insulation layer 60 allows the protection film 70 used in the manufacturing process to be flat. In other words, the protection film 70 does not have to include recesses in the upper surface. This facilitates formation of the protection film 70 and minimizes the manufacturing cost of the protection film 70 thereby minimizing the manufacturing cost of the semiconductor device 10.

(3) The protective insulation layer 60 is not arranged on the cutting lines A2. Thus, the protective insulation layer 60 is not cut during fragmentation when manufacturing the semiconductor devices 10. This prevents delamination between the adhesive layer 30 and the protective insulation layer 60.

It should be apparent to those skilled in the art that the foregoing embodiment may be implemented in many other specific forms without departing from the scope of this disclosure. Particularly, it should be understood that the foregoing embodiment may be implemented in the following forms.

The above embodiment and the following modifications may be combined as long as the combined modifications remain technically consistent with each other.

Figure 8:
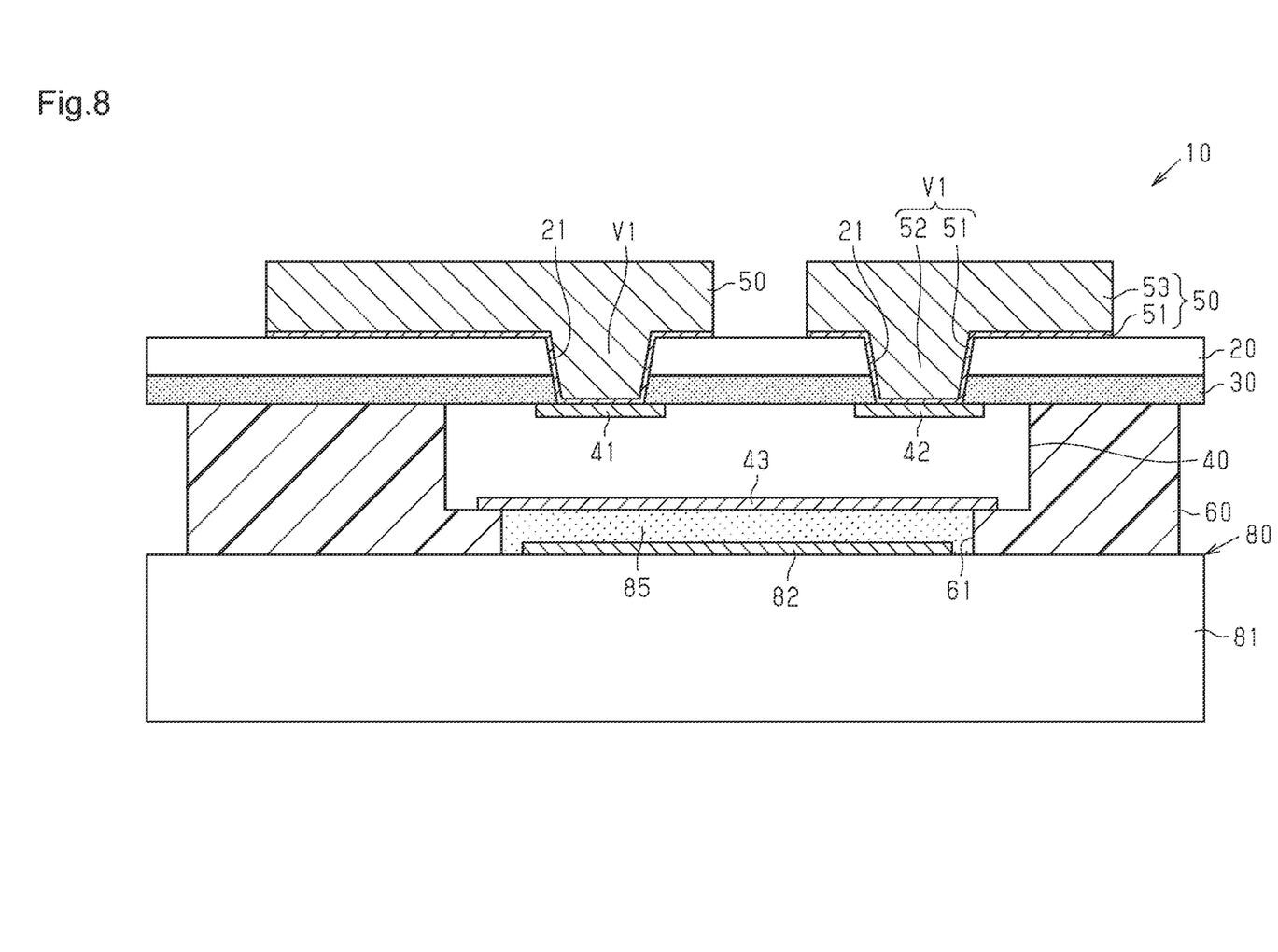
FIGS. 8, 9, and 10 are schematic cross-sectional views of semiconductor devices in accordance with various modified examples.

As illustrated in FIG. 8, the semiconductor device 10 may further include a wiring substrate 80. In this case, for example, the semiconductor element 40 may be mounted on the wiring substrate 80. There is no particular limitation to the structure of the wiring substrate 80. For example, the wiring substrate 80 includes a substrate body 81 and a wiring layer 82 formed on the substrate body 81.

The substrate body 81 is, for example, flat. The substrate body 81 is, for example, a ceramic substrate formed from a ceramic material such as an oxide-based ceramic, a non-oxide-based ceramic, or the like. Examples of an oxide-based ceramic include aluminum oxide ($Al_2O_3$), zirconia ($ZrO_2$), and the like. Examples of a non-oxide-based ceramic include aluminum nitride (AlN), silicon nitride ($Si_3N_4$), and the like. The substrate body 81 is not limited to a single-layered structure. For example, the substrate body 81 may have a stacked structure in which one or more wiring layers are stacked alternately with insulating layers. The material of the wiring layer 82 may be, for example, copper or a copper alloy.

The semiconductor element 40 may be mounted on, for example, the upper surface of the wiring substrate 80. In this case, the electrode 43 of the semiconductor element 40 may be, for example, electrically connected to the wiring pattern (wiring layer 82) of the wiring substrate 80 by a conductive connecting member 85. The connecting member 85 may be arranged in the opening 61 of the protective insulation layer 60. For example, the opening 61 may be filled with the connecting member 85.

The material of the connecting member 85 may be, for example, a metal wax or a conductive paste such as solder or silver paste. Further, the material of the connecting member 85 may be, for example, a sintering material that is formed from a metal. Alternatively, a sintering material may be, for example, a sintering material (silver sintering material) including silver (Ag) particles as a main component or a sintering material (copper sintering material) including copper particles as a main component.

In the modified example of FIG. 8, the wall surface of the opening 61 of the protective insulation layer 60 may act as a dam member that restricts the outflow of the connecting member 85. Thus, a dam member does not need to be arranged in addition to the protective insulation layer 60.

Figure 9:
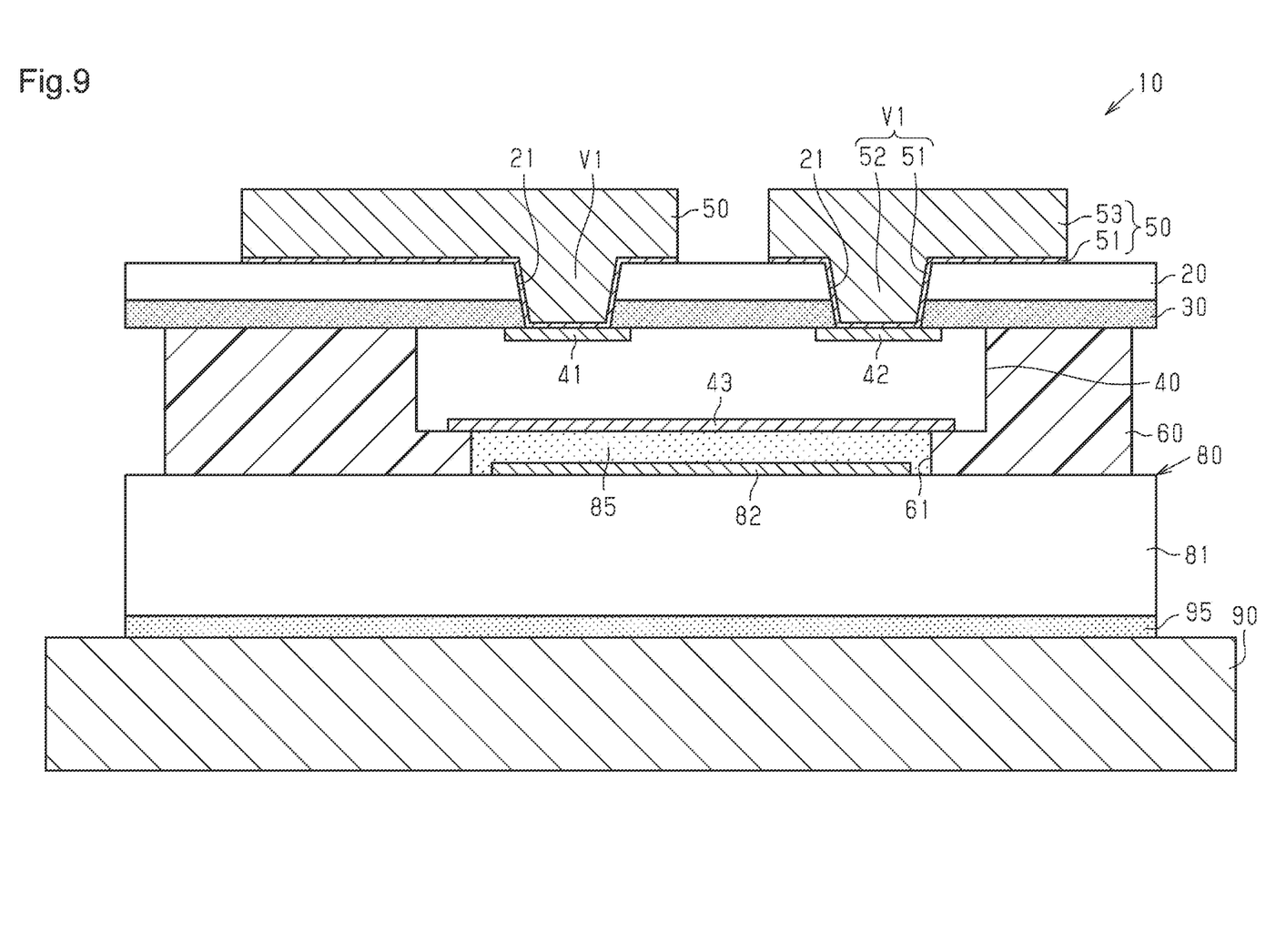

As illustrated in FIG. 9, the semiconductor device 10 may further include a heat dissipation member 90. The heat dissipation member 90 may be mounted on, for example, the lower surface of the wiring substrate 80. The heat dissipation member 90 is adhered to the lower surface of the substrate body 81 by, for example, an adhesive member 95.

The heat dissipation member 90 is, for example, flat. For example, the heat dissipation member 90 has a functionality to dissipate the heat produced by the semiconductor element 40. The material of the heat dissipation member 90 may be, for example, a material having a thermal conductivity of 20 W/mK or greater. The material of the heat dissipation member 90 may be, for example, a ceramic having a superior thermal conductivity such as aluminum nitride, silicon carbide, alumina, or the like. Further, the material of the heat dissipation member 90 may be, for example, a metal material having a superior thermal conductivity such as copper, aluminum, or the like. Alternatively, the material of the heat dissipation member 90 may be, for example, an alloy including one or more metals selected from copper, aluminum, and the like. When copper or aluminum is used as the material of the heat dissipation member 90, for example, a surface-processed layer may be formed on the surface of the heat dissipation member 90 to inhibit oxidation. Examples of a surface-processed layer include a plating layer such as an Au layer, a Ni layer/Au layer, a Ni layer/Pd layer/Au layer, or the like. Further, when aluminum is used as the material of the heat dissipation member 90, for example, a surface-processed layer may be formed on the surface of the heat dissipation member 90 after the surface undergoes a Zincate treatment.

The adhesive member 95 covers, for example, the entire lower surface of the substrate body 81 of the wiring substrate 80. The adhesive member 95 may be, for example, epoxy-based, polyimide-based, silicone-based, or the like. Alternatively, the adhesive member 95 may be, for example, a synthetic rubber-based adhesive. Also, the adhesive member 95 may be a material having a high thermal conductivity such as a thermal interface material (TIM) or the like. The thermal interface material may be formed from, for example, a soft metal such as indium (In), silver, or the like or an organic resin binder that includes a silicone gel, a metal filler, graphite, or the like. When the adhesive member 95 is formed from a material having a high thermal conductivity, heat produced in the semiconductor element 40 is effectively transferred to the heat dissipation member 90.

Figure 10:
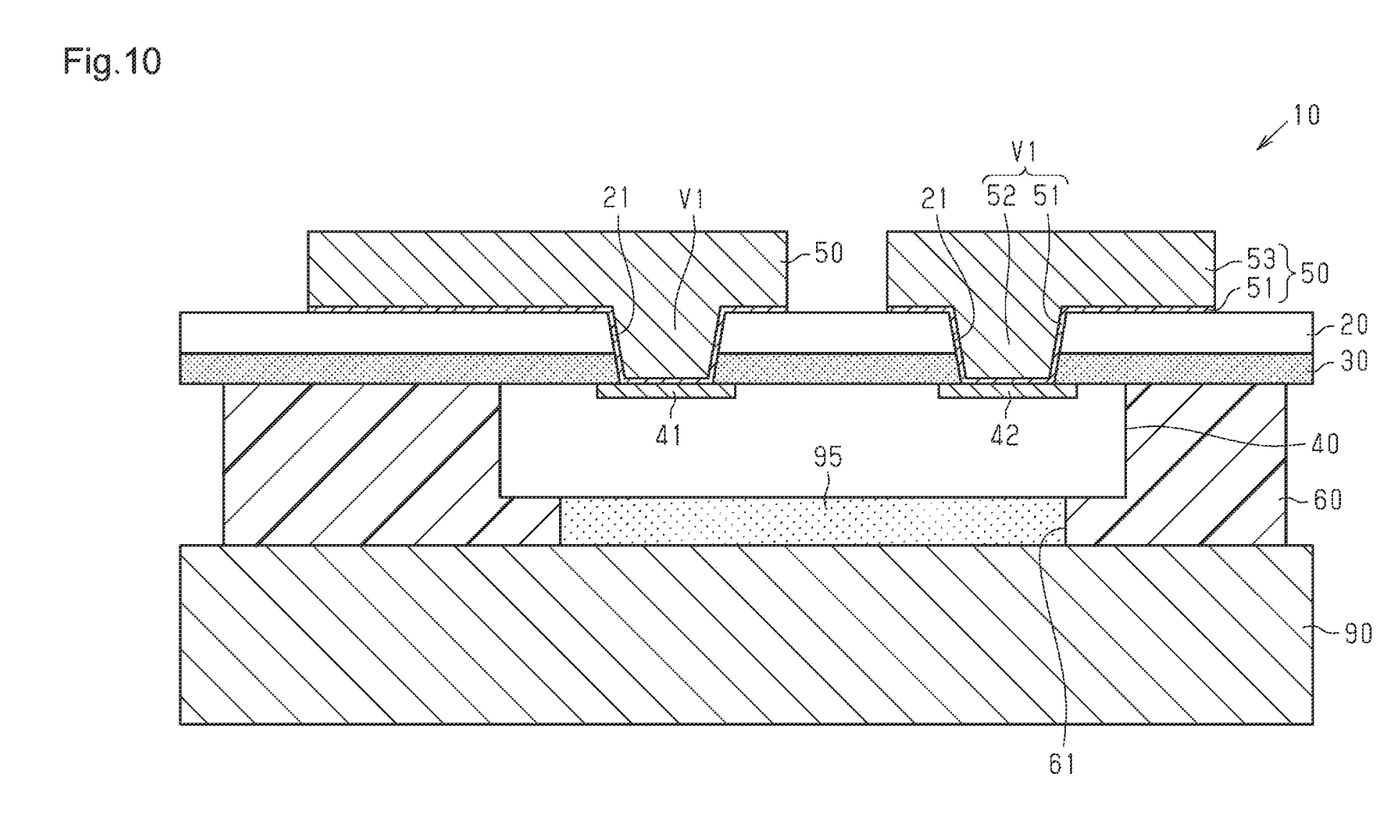

As illustrated in FIG. 10, the heat dissipation member 90 may be arranged on the lower surface of the protective insulation layer 60. For example, the heat dissipation member 90 is adhered to the lower surface of the semiconductor element 40 by the adhesive member 95. The adhesive member 95 may be arranged in the opening 61 of the protective insulation layer 60. For example, the opening 61 may be filled with the adhesive member 95. In this case, for example, the electrode 43 (refer to FIG. 1) may be omitted from the lower surface of the semiconductor element 40.

In the above embodiment, a single wiring layer 50 is arranged on the upper surface of the substrate 20. However, there is no limitation to such a structure. For example, a structural body formed by alternately stacking wiring layers and insulating layers may be arranged on the upper surface of the substrate 20.

In the above embodiment, the seed layer 51 is formed in the step of FIG. 4B and then the protective insulation layer 60 is formed on the lower surface of the adhesive layer 30 in the step of FIG. 5A. However, these manufacturing processes may be performed in any order. For example, the protective insulation layer 60 may be formed on the lower surface of the adhesive layer 30 and then the seed layer 51 may be formed to cover the upper surface of the substrate 20 and the wall surface of the through hole 21.

In the above embodiment, the outer side surfaces of the substrate 20 is flush with the outer side surfaces of the adhesive layer 30. However, the outer side surfaces of the substrate 20 do not have to be flush with the outer side surfaces of the adhesive layer 30.

In the above embodiment, the outer side surfaces of the protective insulation layer 60 may be flush with the outer side surfaces of the substrate 20 and the outer side surfaces of the adhesive layer 30. In this case, for example, the protective insulation layer 60 is formed on the cutting lines A2.

In the above embodiment, the semiconductor element 40 includes three electrodes 41, 42, and 43. However, the number of electrodes on the semiconductor element 40 is not limited in particular. For example, as illustrated in FIG. 10, the semiconductor element 40 may include two electrodes 41 and 42.

The structure and functionality of the semiconductor device 10 are not particularly limited as long as the semiconductor device 10 includes the substrate 20, the adhesive layer 30, the semiconductor element 40 adhered to the adhesive layer 30, and the protective insulation layer 60 that covers the entirety of all the side surfaces as well as covers the lower surface of the semiconductor element 40.

CLAUSES

This disclosure further encompasses the following embodiment.
1. A method for manufacturing a semiconductor device, the method including:
  preparing a structural body including a substrate and an adhesive layer formed on a lower surface of the substrate;
  mounting a semiconductor element on a lower surface of the adhesive layer;
  forming a protective insulation layer on the lower surface of the adhesive layer, the protective insulation layer covering an entirety of all side surfaces of the semiconductor element and covering a peripheral part of a lower surface of the semiconductor element and exposing a central part of the lower surface of the semiconductor element; and
  forming a wiring layer on an upper surface of the substrate, the wiring layer being electrically connected to a first electrode arranged on an upper surface of the semiconductor element.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

What is claimed is:

1. A semiconductor device, comprising:
  a substrate;
  an adhesive layer formed on a lower surface of the substrate;
  a semiconductor element adhered to a lower surface of the adhesive layer;
  a through hole that extends through the substrate and the adhesive layer and exposes a first electrode arranged on an upper surface of the semiconductor element;
  a via wiring formed in the through hole;
  a wiring layer formed on an upper surface of the substrate and electrically connected to the first electrode through the via wiring; and
  a protective insulation layer formed on the lower surface of the adhesive layer, wherein the protective insulation layer covers an entirety of all side surfaces of the semiconductor element and a peripheral part of a lower surface of the semiconductor element and exposes a central part of the lower surface of the semiconductor element,
  wherein the protective insulation layer includes an opening that exposes a second electrode arranged on the lower surface of the semiconductor element, and
  wherein the protective insulation layer covers a peripheral part of a lower surface of the second electrode as well as the peripheral part of the lower surface of the semiconductor element and the entirety of all the side surfaces of the semiconductor element and exposes a central part of the lower surface of the second electrode through the opening.

2. The semiconductor device according to claim 1, wherein the substrate extends outward beyond an outer side surface of the protective insulation layer.

3. The semiconductor device according to claim 2, wherein an outer side surface of the substrate is flush with an outer side surface of the adhesive layer.

4. The semiconductor device according to claim 1 further comprising:
  a wiring substrate on which the semiconductor element is mounted; and
  a connecting member that is formed in the opening of the protective insulation layer and electrically connects the second electrode to a wiring pattern of the wiring substrate.

5. The semiconductor device according to claim 4, wherein the opening of the protective insulation layer is filled with the connecting member.

6. The semiconductor device according to claim 4, further comprising a heat dissipation member arranged on a lower surface of the wiring substrate.

7. The semiconductor device according to claim 1, wherein the via wiring includes:
  a seed layer that continuously covers a wall surface of the through hole and an upper surface of the first electrode exposed at a bottom of the through hole; and
  a metal layer that is formed on the seed layer and fills the through hole.

8. A semiconductor device comprising:
  a substrate;
  an adhesive layer formed on a lower surface of the substrate;

a semiconductor element adhered to a lower surface of the adhesive layer;

a through hole that extends through the substrate and the adhesive layer and exposes a first electrode arranged on an upper surface of the semiconductor element;

a via wiring formed in the through hole;

a wiring layer formed on an upper surface of the substrate and electrically connected to the first electrode through the via wiring; and a protective insulation layer formed on the lower surface of the adhesive layer, wherein the protective insulation layer covers an entirety of all side surfaces of the semiconductor element and a peripheral part of a lower surface of the semiconductor element and exposes a central part of the lower surface of the semiconductor element, wherein the protective insulation layer includes an opening that exposes a second electrode arranged on the lower surface of the semiconductor element, the semiconductor device further comprising:

a wiring substrate on which the semiconductor element is mounted; and a connecting member that is formed in the opening of the protective insulation layer and electrically connects the second electrode to a wiring pattern of the wiring substrate.

9. The semiconductor device according to claim 8, wherein the substrate extends outward beyond an outer side surface of the protective insulation layer.

10. The semiconductor device according to claim 9, wherein an outer side surface of the substrate is flush with an outer side surface of the adhesive layer.

11. The semiconductor device according to claim 8, wherein the opening of the protective insulation layer is filled with the connecting member.

12. The semiconductor device according to claim 8, further comprising a heat dissipation member arranged on a lower surface of the wiring substrate.

13. The semiconductor device according to claim 8, wherein the via wiring includes:

a seed layer that continuously covers a wall surface of the through hole and an upper surface of the first electrode exposed at a bottom of the through hole; and a metal layer that is formed on the seed layer and fills the through hole.

* * * * *